SOLAR CELL PANELS FROM NONUNIFORM DENDRITES
Filed Sept. 9, 1964
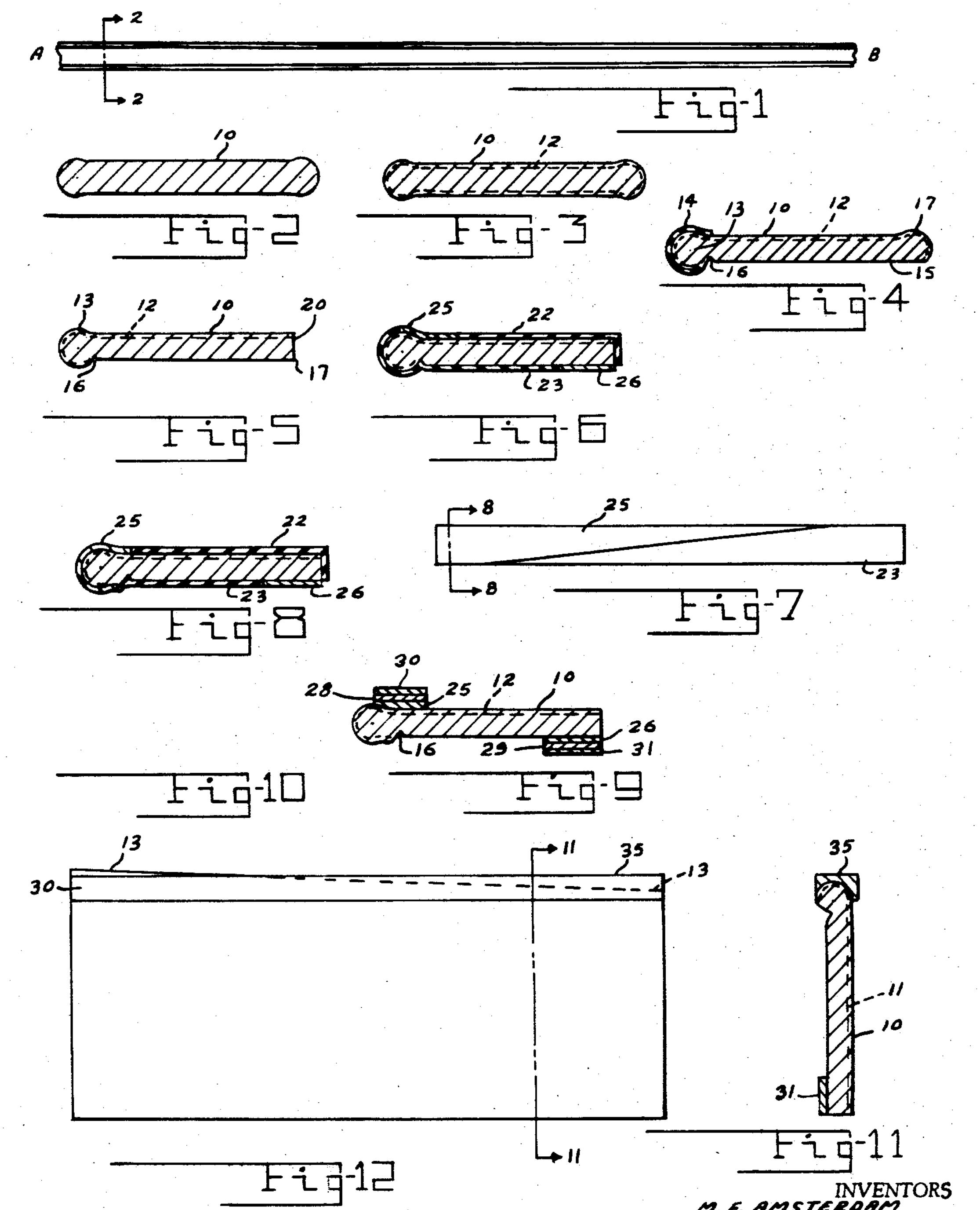
Fig-1, Fig-2, Fig-3, Fig-4, Fig-5, Fig-6, Fig-7, Fig-8, Fig-9, Fig-10, Fig-11, Fig-12
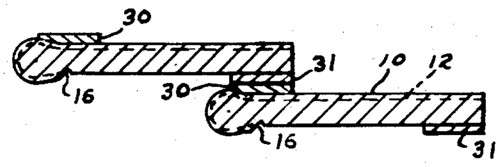
INVENTORS
M. F. AMSTERDAM
M. S. SHAIKH
K. S. TARNEJA
BY Wade Koontz
ATTORNEY
Richard J Killoren
AGENT United States Patent Office 3,418,170
Patented Dec. 24, 1968

3,418,170

SOLAR CELL PANELS FROM NONUNIFORM DENDRITES

Michael F. Amsterdam, Greensburg, Pa., Mohammed S. Shaikh, Mountain View, Calif., and Krishan S. Tarneja, Pittsburgh, Pa., assignors, by mesne assignments, to the United States of America as represented by the Secretary of the Air Force
Filed Sept. 9, 1964, Ser. No. 395,343
1 Claim. (Cl. 136—89)

ABSTRACT OF THE DISCLOSURE

A solar cell panel, made with a nonuniform width N-type dendrite semiconductive material webbing, has a doped layer of P-type material extending over the top, one edge and a portion of the bottom of the panel. A contact for the P-type material extends from the top at one end of the panel over the edge and a portion of the bottom at the other end of the panel. The width of the contact, at the narrow end of the dendrite semiconductive webbing, is equal to the difference in width of the two ends of the dendrite webbing. A contact for the N-type material is provided on the bottom of the panel adjacent the other edge.

This invention relates to solar cell panels of substantially uniform dimensions made from nonuniform dendrite webbing.

One object of the invention is to provide solar cell panels which substantially reduces the problem of shorting of the junction.

Another object of the invention is to provide substantially uniform solar cell panels from available nonuniform dendrite webbing.

These and other objects will be more fully understood from the following detailed description taken with the drawing, wherein:

FIG. 1 is a plan view of a webbed dendrite crystal as received showing the nonuniform width of the dendrite webbing;

FIG. 2 is an enlarged sectional view of a dendrite crystal taken along the line 2—2 of FIG. 1;

FIG. 3 is a schematic showing the device of FIG. 2 after doping;

FIG. 4 shows the device of FIG. 3 with a mask after sandblasting and scratching the bottom surface;

FIG. 5 shows the device of FIG. 4 after lapping the end of the crystal;

FIG. 6 shows the device of FIG. 5 after masking and evaporation of the aluminum layer;

FIG. 7 shows the left side view of the mask of FIG. 6;

FIG. 8 shows the evaporated layers and mask along the line 8—8 of FIG. 7;

FIG. 9 shows the device of FIG. 6 with the nickel and solder applied;

FIG. 10 shows a top view of the finished solar panel with the top contact strip in place;

FIG. 11 shows the device of FIG. 10 along the line 11—11; and

FIG. 12 shows the finished panels as they are fitted together to form the solar cell.

Shingling of individual solar panels to make large area solar cells from dendrite webbing poses a problem because of the nonuniform dimensions of the dendrite webbing. The growth of silicon dendrite webbing depends upon seeding two coplanar dendrites from a single seed. When the web is first seeded, the supporting edge dendrites are usually less than 1/4 inch apart. As the growth continues they separate further, thus widening the sheet. A typical widening rate is about 0.1 inch/foot length.

Thus, as shown in FIG. 1 the dendrite webbing has a greater width at end A than at B. Care must be taken therefore in preparing the standard solar cell panels so that the junction is not shorted when making ohmic contact to the diffused layer at the panel edge. According to this invention the doped layer is left at one edge and extends over a portion of the bottom of the panel. This prevents shorting of the junction and permits the connector to be used to provide panels of substantially uniform width.

Reference is made to FIG. 2 of the drawing which shows an enlarged sectional view of a dendrite panel 10. In preparing the panel for use in a solar cell the panels are first cut to the desired length, after which a layer of impurities is diffused into the surface of dendrite webbing, for example, with N-type starting material, the dendrite panel may be exposed for an optimum time to the penetration of boron gas. A diffusion time of about eight minutes is required for a junction depth of 1 micron. Thus a PN junction is formed at 12 as shown in FIG. 3. The panel is then sand blasted with aluminum oxide abrasive to remove the shiny surface after which the panel is cleaned by heating in trichlorethylene and washed with deionized water. The edge 13 of the panel is then covered with a mask 14. The bottom of the dendrite webbing is then sand blasted to remove the doped material thus leaving the base material exposed at 15. A groove 16 is then scratched in the bottom surface along the boundary between the masked and unmasked portion of the bottom of the panel to provide a clear line between the junction layer and the cleaned base material. The edge 17 of the panel is then lapped with silicon carbide grit or other abrasive to remove the doped material to expose the junction at 20. The end 17 and the bottom, up to and including the groove 16, are then etched in concentrated hydrogen fluoride followed by rinsing in deionized water. The panels may then be placed in hot nitric acid to remove any film formed during the diffusion process after which the panel is again washed, etched with hydrogen fluoride and again washed. The panel is then coated with a standard masking material 22 and 23, as shown in FIGS. 6, 7 and 8, and layers 25 and 26 of aluminum are vacuum evaporated onto the panel. The mask is then removed and nickel layers 28 and 29 are plated onto the aluminum layers. Solder layers 30 and 31 are then added by solder dipping the panel. The thickness of the solder is adjusted to make the width of the panel substantially uniform along its length as shown in FIG. 10 and the thickness of the panel at the edge 13 substantially uniform. Any known method such as scraping or grinding may be used to adjust the thickness of the solder. The thickness of the aluminum, nickel and solder have been exaggerated for the purpose of illustration.

FIGS. 10 and 11 show how the solder layer is coated on the panel so that it extends over the edge 13 toward the narrow end of the panel as shown at 35. The finished panels are located as shown in FIG. 12 to form the solar cell.

There is thus provided solar cell panels of substantially uniform dimensions made from nonuniform starting material.

While a certain specific embodiment has been described, it is obvious that numerous changes may be made without departing from the general principles and scope of the invention.

We claim:

1. A photovoltaic solar cell panel made from available nonuniform width dendrite semiconductive webbing, which has a widening rate from one end to the other of approximately 0.1 inch/foot, comprising: an elongated sheet of said nonuniform width dendrite N-type semiconductive material; a thin layer of P-type semiconductive material on said sheet of semiconductive material and forming therebetween a P-N junction; said thin layer of P-type semiconductive material extending across one surface over one edge and over a portion of the other surface of said panel; a first contact on said panel at said one edge extending the full length of said panel; said first contact extending from the top of said panel at one end gradually over the edge and to a portion of said other surface adjacent said thin layer of P-type semiconductive material at the other end; the width of said first contact adjacent said one edge at the other end of said panel being substantially equal to the difference in width of the two ends of said dendrite webbing whereby said panel and said contact together form a photovoltaic panel of substantially uniform width; and a second contact on said other surface of said panel adjacent the other edge thereof.

References Cited

UNITED STATES PATENTS

| | | | |
|---|---|---|---|
| 2,823,245 | 2/1958 | Solow | 136—89 |
| 2,938,938 | 5/1960 | Dickson | 136—89 |
| 3,129,061 | 4/1964 | Dermatis et al. | 148—1.6 X |
| 3,255,047 | 6/1966 | Escoffery | 136—89 |
| 3,278,811 | 10/1966 | Mori | 136—89 X |

FOREIGN PATENTS

| | | |
|---|---|---|
| 1,338,752 | 8/1963 | France. |

ALLEN B. CURTIS, *Primary Examiner.*